United States Patent
Novellini et al.

(10) Patent No.: US 9,331,724 B2
(45) Date of Patent: May 3, 2016

(54) LANE-TO-LANE DE-SKEW FOR TRANSMITTERS

(71) Applicant: Xilinx, Inc., San Jose, CA (US)

(72) Inventors: Paolo Novellini, Gorgonzola (IT); Giovanni Guasti, Cornaredo (IT)

(73) Assignee: XILINX, INC., San Jose, CA (US)

( * ) Notice: Subject to any disclaimer, the term of this patent is extended or adjusted under 35 U.S.C. 154(b) by 67 days.

(21) Appl. No.: 14/486,820

(22) Filed: Sep. 15, 2014

(65) Prior Publication Data

US 2016/0080008 A1 Mar. 17, 2016

(51) Int. Cl.
| | |
|---|---|
| *G06F 3/00* | (2006.01) |
| *H04B 1/04* | (2006.01) |
| *G06F 1/10* | (2006.01) |
| G06F 5/06 | (2006.01) |
| G11C 7/22 | (2006.01) |
| H04L 25/05 | (2006.01) |

(52) U.S. Cl.
CPC ............... *H04B 1/0475* (2013.01); *G06F 1/10* (2013.01); *G06F 5/06* (2013.01); *G11C 7/22* (2013.01); *G11C 7/222* (2013.01); *H04L 25/05* (2013.01)

(58) Field of Classification Search
CPC ............... G06F 1/10; G06F 5/06; G11C 7/22; G11C 7/222; H04L 25/05
USPC ........................................................ 710/58
See application file for complete search history.

(56) References Cited

U.S. PATENT DOCUMENTS

| | | | |
|---|---|---|---|
| 7,454,537 B1 | 11/2008 | Xue | |
| 7,594,048 B1 | 9/2009 | Edwards et al. | |
| 8,285,944 B1 * | 10/2012 | Nelson, IV | 711/149 |
| 8,386,828 B1 | 2/2013 | Ambatipudi et al. | |
| 2013/0249719 A1 | 9/2013 | Ryan | |
| 2014/0089718 A1 * | 3/2014 | Kain | 713/500 |

FOREIGN PATENT DOCUMENTS

GB 2505002 A 2/2014

OTHER PUBLICATIONS

Wikipedia, "Gray code," Mar. 18, 2014, pp. 1-16, http://en/wikipedia.org/wiki/Gray_code.
Xilinx, Inc., *7 Series FPGAs GTX/GTH Transceivers*, UG476 (v1.10), Feb. 11, 2014, pp. 1-494, in particular pp. 123-134,, Xilinx, Inc., San Jose, California, USA.

* cited by examiner

*Primary Examiner* — Ernest Unelus
(74) *Attorney, Agent, or Firm* — W. Eric Webostad

(57) ABSTRACT

In a method relating generally to starting a plurality of transmitters, a sequence is initiated for each of the plurality of transmitters having corresponding data buffers. Latency is set for each of the data buffers responsive to execution of the sequence. The sequence includes: obtaining a read address associated with a read clock signal; obtaining a write address associated with a write clock signal; determining a difference between the read address and the write address; asserting a flag signal associated with the difference; and adjusting the read clock signal to change the difference to locate a change of state location for the flag signal to set the latency for a data buffer of the data buffers.

20 Claims, 6 Drawing Sheets

LANE-TO-LANE DE-SKEW FOR TRANSMITTERS

TECHNICAL FIELD

The following description relates to integrated circuit devices ("ICs"). More particularly, the following description relates to lane-to-lane de-skew for transmitters of an IC.

BACKGROUND

Generally, at startup or reset of a transmitter, such as a transmitter used in a serializer-deserializer ("SERDES"), a buffer bypass mode was used. This buffer bypass mode was used to avoid skew introduced by a buffer of a transmitter for example. As data may be serialized over multiple lanes, multiple transmitters may introduce lane-to-lane skew by parallel use of their respective buffers, such as first-in, first-out buffers ("FIFOs"). However, a buffer bypass mode has significant circuitry overhead, among other limitations.

Furthermore, a clock network, such as an H clock tree or other clock network, may be used to provide a write clock to FIFOs corresponding to multiple transmitters. A clock network may have significant variance with such temperature variation. To compensate for such variation, a delay aligner may be used to adjustably drive a write clock into such clock network. A delay aligner may be a complex analog circuit, and use of a delay aligner may thus add to circuitry overhead of a buffer bypass mode of operation. Additionally, phase variation between write and read clocks may cut into timing margin, and as integrated circuits become more dense and larger, circuit may be more susceptible to differences in signal propagation delay, namely more susceptible to lane-to-lane skew.

Hence, it is desirable to provide skew equalization among multiple transmitters without one or more of the above-described limitations.

SUMMARY

A method relates generally to starting a plurality of transmitters. In such a method, a sequence is initiated for each of the plurality of transmitters having corresponding data buffers. Latency is set for each of the data buffers responsive to execution of the sequence. The sequence includes: obtaining a read address associated with a read clock signal; obtaining a write address associated with a write clock signal; determining a difference between the read address and the write address; asserting a flag signal associated with the difference; and adjusting the read clock signal to change the difference to locate a change of state location for the flag signal to set the latency for a data buffer of the data buffers.

Another method relates generally to starting a plurality of transmitters. In such a method, a sequence is initiated for each of the plurality of transmitters having corresponding data buffers. Latency is set for each of the data buffers responsive to execution of the sequence. The sequence includes: obtaining a read address associated with a read clock signal; obtaining a write address associated with a write clock signal; determining a difference between the read address and the write address; asserting a flag signal associated with the difference; adjusting the read clock signal to change the difference; and repeating the steps of the sequence to locate a change of state location of the flag signal. The change of state location is for a domain crossing between a read time domain of the read clock signal and a write time domain of the write clock signal. The latency for a data buffer of the data buffers is set to the change of state location.

An integrated circuit device relates generally to having a plurality of transmitters. In such an integrated circuit device, a first transmitter of the plurality of transmitters includes a first data buffer and a first input/output control block coupled to the first data buffer. A second transmitter of the plurality of transmitters includes a second data buffer and a second input/output control block coupled to the second data buffer. The first data buffer has a first delay. The second data buffer has a second delay. The first input/output control block is coupled to receive a write clock signal and a first read clock signal and configured to generate a first write address and a first read address respectively therefor. The first input/output control block is configured to determine a first difference between the first write address and the first read address and to assert a first flag signal associated with the first difference. The first input/output control block is coupled to feedback the first flag signal to adjust the first read clock signal to adjust the first difference to reach a first change of state location for the first flag signal associated with a first position in the first data buffer. The second input/output control block is coupled to receive the write clock signal and a second read clock signal and configured to generate a second write address and a second read address respectively therefor. The second input/output control block is configured to determine a second difference between the second write address and the second read address and to assert a second flag signal associated with the second difference. The second input/output control block is coupled to feedback the second flag signal to adjust the second read clock signal to adjust the second difference to reach a second change of state location for the second flag signal associated with a second position in the second data buffer.

Other features will be recognized from consideration of the Detailed Description and Claims, which follow.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

DETAILED DESCRIPTION

Figure 1:
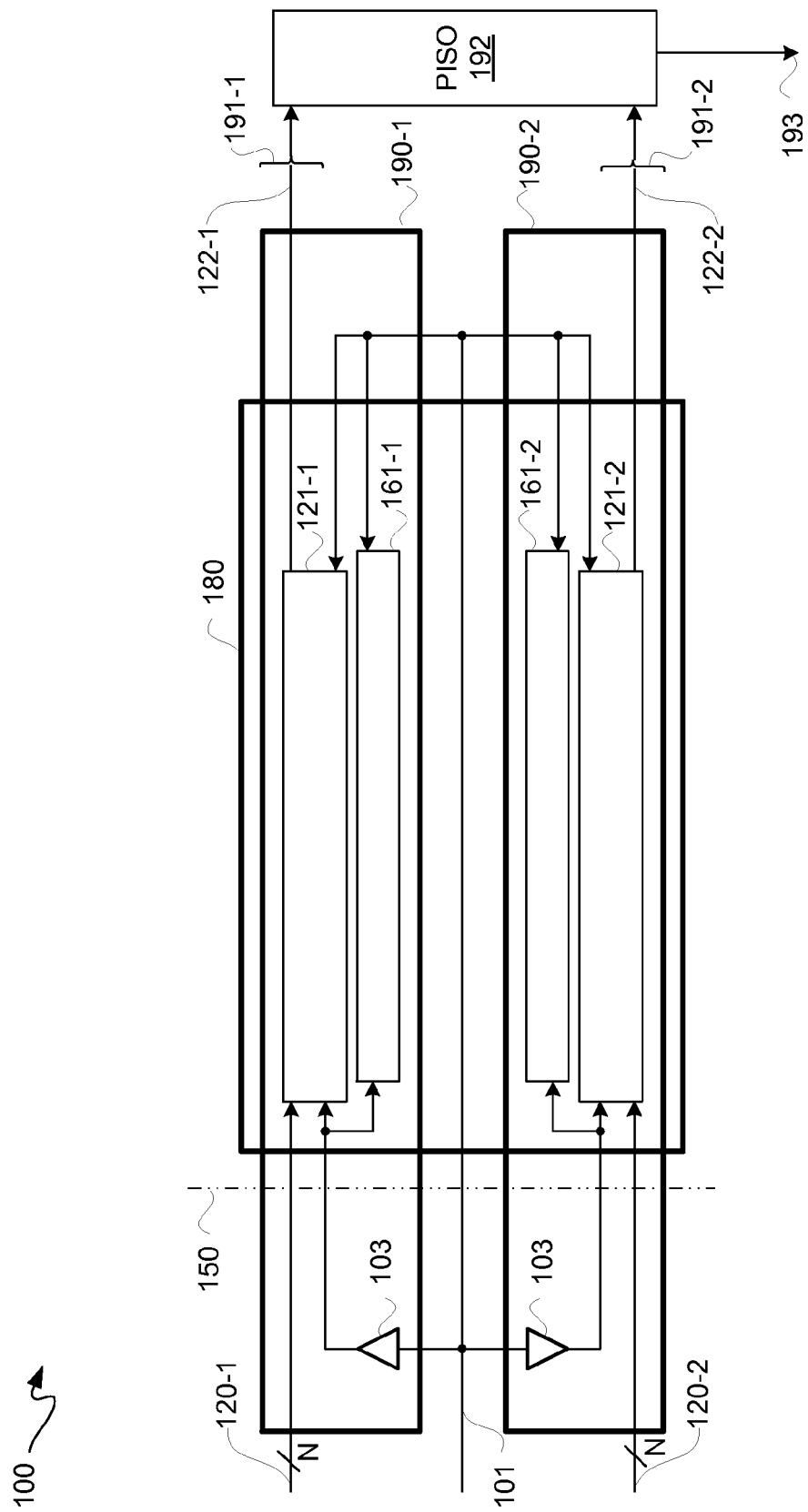
FIG. 1 is a block diagram depicting an exemplary integrated circuit device having transmitters.

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Before describing the examples illustratively depicted in the several figures, a general introduction is provided to further understanding.

As data may be serialized over multiple lanes, multiple transmitters may introduce lane-to-lane skew by parallel use of their respective buffers, such as first-in, first-out buffers ("FIFOs"). As described below in additional detail, a phase interpolator of each transmitter may be used to adjust phase of a read clock signal ("read clock") provided from such phase interpolator to read data out of a transmitter's FIFO. Each read clock may thus be phase aligned to a commonly sourced write clock signal ("write clock") provided to each FIFO of the transmitters, though subject to some differences in propagation delay, namely write clocks sourced from common write clock.

Conventionally, a FIFO is in a transmitter data path prior to serialization of data. Generally, data, which may be from FPGA fabric or other circuitry, is input or written to a FIFO responsive to a pulse edge or edges of an input or write clock signal. This data may have a bit width of N, for N equal to or greater than 1. Such FIFO may be memory and/or a set of registers. A FIFO may be able to store multiple sets of inputs, namely multiple words. Along those lines, a FIFO may be described as having a depth, M, for storing up to M words, where each of such M words may be N bits wide. Thus, up to M instances of N-bit wide words may be stored in a FIFO at one time.

A FIFO in a transmitter may be used, at least in part, to buffer data by absorbing skew associated with differences in propagation delay of an input or write clock signal provided via a clock network. A clock network for distributing an input or write clock signal to multiple transmitters may have significant FIFO-to-FIFO skew due to propagation delays, which propagations delays may be sensitive to voltage and/or temperature. In contrast, an output or read clock signal may be provided from a phase interpolator or other circuit internal to a transmitter or transceiver, and thus may not have as significant FIFO-to-FIFO skew due to such proximity. Thus, for example, a same reference clock provided to a delay aligner for driving a read clock signal onto a clock network for clocking an input-side or write-side of a FIFO and to a phase interpolator of a transmitter for clocking an output-side or read-side of such FIFO may have substantially different propagation delays. Along those lines, a depth of a FIFO conventionally is to accommodate a largest propagation delay, namely FIFOs are conventionally sized according to propagation delay of an input or write clock signal for purposes of starting up or resetting an integrated circuit device.

Additionally, a transmitter FIFO may be reset or started up in an unknown state. For example, a transmitter FIFO reset may be a last operation in a reset procedure for a SERDES. After reset of a transmitter FIFO, such FIFO may be "roughly" half full. However, data to be transmitted in multiple FIFOs of SERDES transmitters is generally not aligned, or at least not sufficiently aligned, by a "roughly" half full status. In other words, channels may be in any of three states, namely more full than empty, more empty than full, or at a midpoint, and such variation among channels may not be sufficient for some applications.

In the past, phase equalization between read clock signals and a commonly sourced write clock signal was used with a "bypass" of FIFOs to form a SERDES. In a "buffer bypass mode", a complex analog phase detector circuit, sometimes referred to a delay aligner, was used to maintain phase alignment. Each transmitter delay aligner was used to cause each transmitter phase interpolator to bring a corresponding read clock signal into a known phase relationship with a commonly sourced write clock signal, where each FIFO was operated with a depth of one word only. However, during operation, phase of a common write clock signal was adjusted to keep it in phase with each read clock signal, as use of a transmitter's phase interpolator during operation would introduce unwanted jitter. During operation, a write clock signal may go out of phase with respect to a read clock signal due to issues with a clock network, sometime referred to as a clock tree, H-tree, or other type of clock network. For example, a clock network may be sensitive to temperature, and thus temperature changes may cause differences in propagation delays of a commonly sourced write clock signal provided to different transmitters. Again, respective transmitter delay aligners were used to compensate for such differences to adjust corresponding transmitter write clock signals sourced from a common write clock signal to be in phase with corresponding read clock signals of such transmitters. Thus, lane-to-lane skew may be within a phase alignment window as between transmitters with FIFOs reduced to storing only one vector at a time. However, with larger clock networks, wider data buses, and/or narrower phase alignment windows, use of a buffer bypass mode has become more problematic, aside from the substantial overhead involved in using complex analog delay aligners.

As described below in additional detail, all transmitter data buffers of a SERDES may be set to exactly, subject to PI granularity, half full and not "roughly" half full. Such setting may be used to effectively equalize latency among all data buffers of a SERDES transmitter, so lane-to-lane skew is substantially reduced. Along those lines, a flag signal is generated to indicate state of a data buffer. This flag signal is fed back for phase adjustment of an output clock signal provided to such data buffer. This adjustment may be iteratively incremented, or decremented, to find a position in such data buffer where state of such flag signal toggles, such as from a logic 1 to a logic 0 or vice versa. All data buffers of a SERDES transmitter may likewise be set to such location to equalize latency across such data buffers.

With the above general understanding borne in mind, various configurations for an integrated circuit device having a plurality of transmitters are generally described below.

FIG. 1 is a block diagram depicting an exemplary integrated circuit device 100 having a plurality of transmitters 190. In this example, only two transmitters 190-1 and 190-2 are illustratively depicted; however, in other instances more than two transmitters may be used. Furthermore, transmitters 190 may be of corresponding transceivers or may be separate transmitters. Transmitters 190-1 and 190-2 may correspond to lanes 191-1 and 191-2. Lanes 191-1 and 191-2 may have a maximum lane-to-lane skew for parallel data distributed across transmitters 190-1 and 190-2 to be readied for serialization.

A first transmitter 190-1 of transmitters 190 includes a first data buffer 121-1 and a first input/output control block 161-1 coupled to first data buffer 121-1. A second transmitter 190-2 of transmitters 190 includes a second data buffer 121-2 and a second input/output control block 161-2 coupled to second data buffer 121-2.

First data buffer 121-1 has a first delay, and second data buffer 121-2 has a second delay. These first and second delays may be different from one another, including without limitation at startup or reset of integrated circuit device 100. Along those lines, input data 120-1 may be provided for clocked input to first data buffer 121-1, and input data 120-2 may be provided for clocked input to second data buffer 121-2. Output data 122-1 may be output responsive to clocked output from first data buffer 121-1, and output data 122-2 may be output responsive to clocked output from second data buffer 121-2.

In this example, first input data 120-1 and second input data 120-2 are provided from an integrated circuit programmable fabric to a serializer-deserializer 180, as generally indicated by boundary 150. In particular, integrated circuit programmable fabric may be of a Field Programmable Gate Array. However, first input data 120-1 and second input data 120-2 may be from any integrated circuit programmable fabric and/or application specific resources, or even pass through data, to a serializer-deserializer ("SERDES") 180 formed of two or more transmitters of integrated circuit device 100.

Along those lines, first output data 122-1 and second output data 122-2 may be input to a Parallel-Input-to-Serial-Output data converter ("PISO") 192 to obtain serial data 193 output from such PISO. Because of a difference between first and second delays of data buffers 121-1 and 121-2, respectively, there may be lane-to-lane skew with respect to first output data 122-1 and second output data 122-2, which differences may be addressed as described below. In other words, first transmitter 190-1 and second transmitter 190-2 may both be of a SERDES transmitter 180 coupled to receive parallel data as N-bit wide words or portions of words via input data 120-1 and 120-2. SERDES transmitter 180 may be coupled to provide such parallel data respectively in a first lane for output data 122-1 and a second lane for output data 122-2 for conversion to serial data by a PISO.

Figure 2:
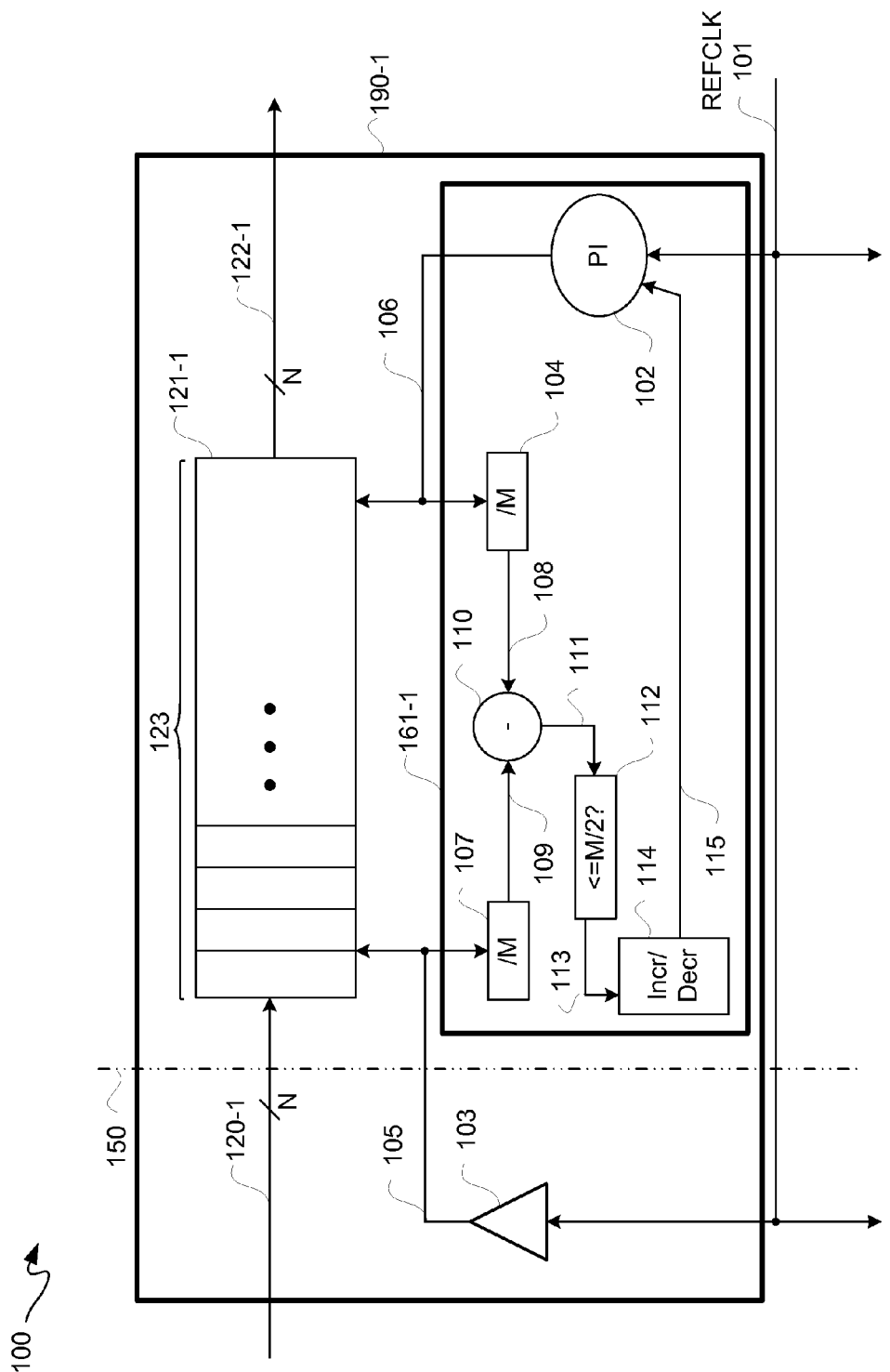
FIGS. 2 and 3 are block diagrams depicting an exemplary transmitters of the integrated circuit device of FIG. 1.
Figure 3:
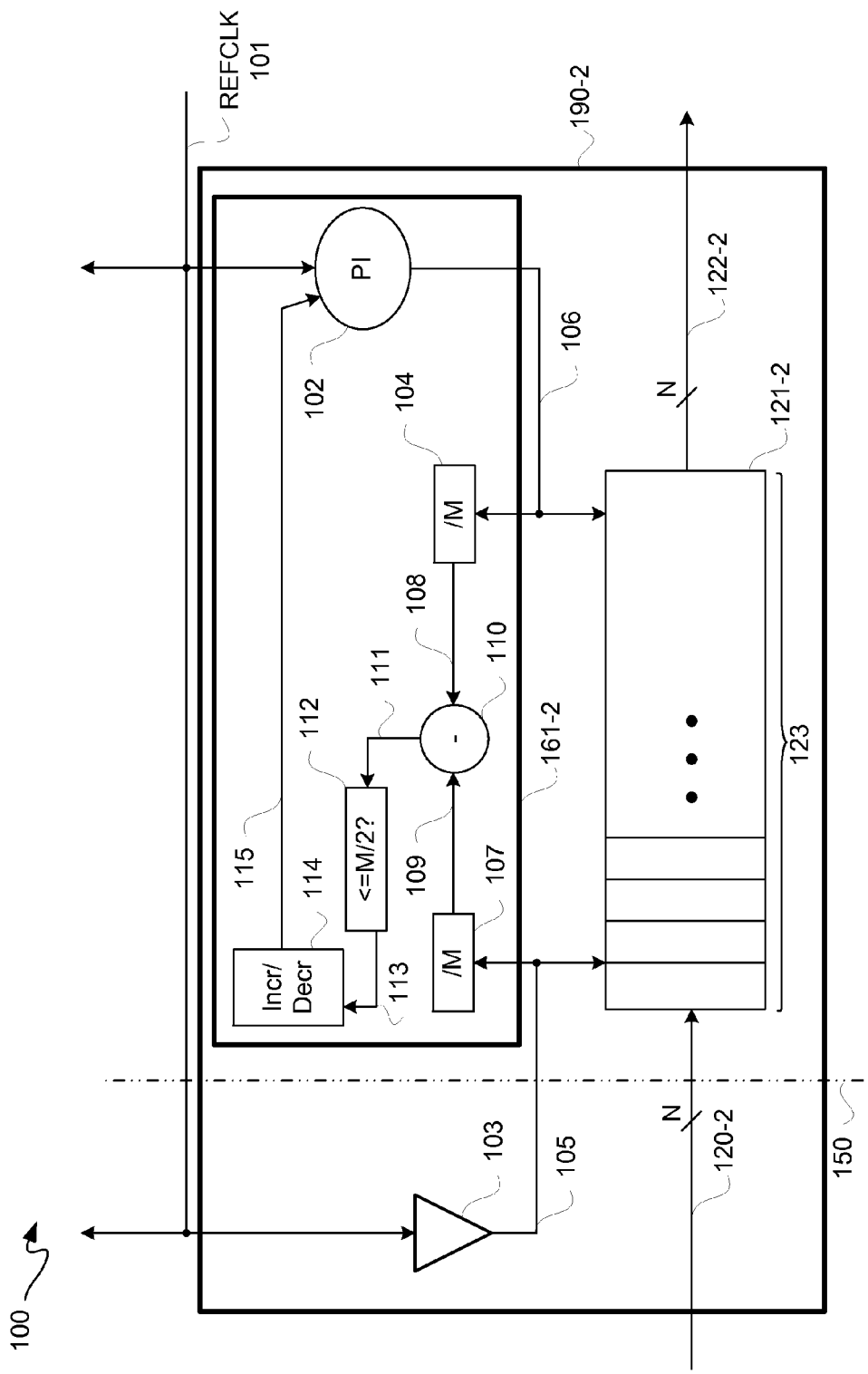

FIG. 2 is a block diagram depicting an exemplary transmitter 190-1 of integrated circuit device 100, and FIG. 3 is a block diagram depicting an exemplary transmitter 190-2 of integrated circuit device 100. With simultaneous reference to FIGS. 1-3, integrated circuit device 100 is further described.

Write clock signals 105 of transmitters 190 may be commonly sourced from a reference clock signal 101. Reference clock signal 101 may be provided to phase interpolators 102 respectively of transmitters 190, as well as to a clock network of integrated circuit device 100. For purposes of clarity and not limitation, a clock network is generally depicted as buffers 103. Thus, a reference clock signal 101 may be input to buffers 103 for distribution of local write clock signals 105 respectively to transmitters 190. Accordingly, local write clock signals 105 may have different propagation delays, and thus may not all reach their respective transmitter destinations at the same time, namely such local write clock signals 105 may be out-of-phase with respect to one another as well as being out of phase with respect to corresponding local read clock signals 106 of such transmitters 190. Additionally, a clock tree unbalancing at different SERDES may nominally be compensated for by embedding unbalancing numbers in registers of input/output control block 161, for example such as an offset address for adding to/subtracting from a write address 109 output from divider 107. Lastly, read clock signals 106 are locally generated as associated with corresponding transmitters 190, and thus read clock signals 106 among transmitters 190 generally are out-of-phase with respect to one another.

First input/output control block 161-1 may be for controlling inputting, such as writing or loading, of input data 120-1 into first data buffer 121-1 and for controlling outputting, such as reading or unloading, of output data 122-1 from first data buffer 121-1. Likewise, second input/output control block 161-2 may be for controlling inputting, such as writing or loading, of input data 120-2 into second data buffer 121-2 and for controlling outputting, such as reading or unloading, of output data 122-2 from second data buffer 121-2.

As first and second transmitters 190 have the same configuration, generally only one of transmitters 190 is described below in additional detail for purposes of clarity. Additionally, for purposes of clarity and not limitation, it shall be assumed that data buffers 121 are first-in-first-out data buffers ("FIFOs"). Such FIFOs 121 may be formed of memory cells and/or sets of registers. For purposes of clarity and not limitation, it shall be assumed that write clocking and read clocking may be used to generate sets of vectors, namely it shall be assumed that FIFOs 121 are formed of sequentially accessed memory for purposes of clarity.

First input/output control block 161-1 is coupled to receive a write clock signal 105 and a first read clock signal 106 respectively to dividers 107 and 104 to generate a first write address 109 and a first read address 108 respectively therefor. First input/output control block 161-1 may be configured to determine a first difference 111 between each first write address 109 and each first read address 108. First input/output control block 161-1 may be configured to assert a first flag signal 113 associated with each such first difference 111. First input/output control block 161-1 may be coupled to feedback each such first flag signal 113 to adjust first read clock signal 106 to adjust first difference 111 to reach a first change of state location for first flag signal 113 associated with a position in first data buffer 121-1.

Second input/output control block 161-2 may be receive a write clock signal 105 and a second read clock signal 106 and configured to generate a second write address 109 and a second read address 108 respectively therefor. Second input/output control block 161-2 may be configured to determine a second difference 111 between each second write address 109 and each second read address 108. Second input/output control block 161-2 may be configured to assert a second flag signal 113 associated with each such second difference 111. Second input/output control block 161-2 may be coupled to feedback each such second flag signal 113 to adjust such second read clock signal 106 to adjust such a second difference 111 to reach a second change of state location for such second flag signal 113 associated with a position in second data buffer 121-2.

First input/output control block 161-1 may include a first phase interpolator ("PI") 102. Likewise, second input/output control block 161-2 may include a second phase interpolator 102.

A first phase interpolator 102 may be coupled to receive a first flag signal 113 as feedback to adjust first read clock signal 106. More particularly, a first increment/decrement control block 114, which is conventionally included in a phase interpolator 102 but is illustratively shown separately here for purposes of clarity, may receive first flag signal 113 to determine whether to increment, decrement, or maintain, a first position as selected by an adjustment signal 115, where such first position is associated with delay of such first read clock signal 106 output from such first phase interpolator 102.

Likewise, a second phase interpolator 102 of second input/output control block 161-2 may be coupled to receive a second flag signal 113 as feedback to adjust a second read clock signal 106. A second increment/decrement control block 114 of such second phase interpolator 102 may receive such second flag signal 113 to determine whether to increment, decrement, or maintain, a second position as selected by an adjustment signal 115, where such second position is associated with delay of such second read clock signal 106 output from such second phase interpolator 102.

Such first position and such second position correspond to a first location or point in a unit interval ("UI") of such first phase interpolator 102 and a second location or point in a unit interval of such second phase interpolator 102. For example, at startup, such first point may initially be associated with a first delay of a FIFO 121-1, where such first delay is adjustable, and such second point may initially be associated with a second delay of a FIFO 121-2, where such second delay is adjustable.

First phase interpolator 102 may be adjusted responsive to first flag signal 113 to locate a first domain crossing between a first read time domain of first read clock signal 106 and a first write domain of write clock signal 105. Likewise, a second phase interpolator 102 may be adjusted responsive to a second flag signal 113 to locate a second read time domain of a second read clock signal 106 and a second write domain of such a write clock signal 105.

Because only FIFOs 121 are directly within a data path of data flow, depth, M, 123 of each of FIFOs 121 may result in different delays among such FIFOs, including without limitation at startup or reset of transmitters 190, resulting in different latencies among two or more FIFOs 121. In this example, each of FIFOs 121 is capable of holding M words of N-bits each, for M an integer greater than one.

A first phase interpolator 102 and a second phase interpolator 102 may be adjusted for equalization of a first delay associated with FIFO 121-1 and a second delay associated with FIFO 121-2 respectively associated with such a first domain crossing and such a second domain crossing. Thus, output data 122-1 and 122-2 respectively from FIFOs 121-1 and 121-2 may be effectively data phase aligned. In brief, FIFOs 121 may be data phase aligned with respect to one another, without having each read clock signal phase aligned with a commonly sourced write clock signal. Thus, use of a complex analog delay aligner circuit of a transmitter to maintain phase alignment of a local write clock signal to a local read clock signal may be avoided. Additionally, components of input/output control blocks 161 may be digital circuits, and some of these digital circuits in some transmitters may be available generally to provide indications of underflow and/or overflow of a corresponding FIFO. Thus, by tasking such components to provide a feedback flag signal 113 as described above, each transmitter of a SERDES may be independently adjusted and all of such transmitters of such a SERDES may have at least substantially the same data latency after such independent adjustment of each, namely lane-to-lane skew is substantially reduced.

Figure 4:
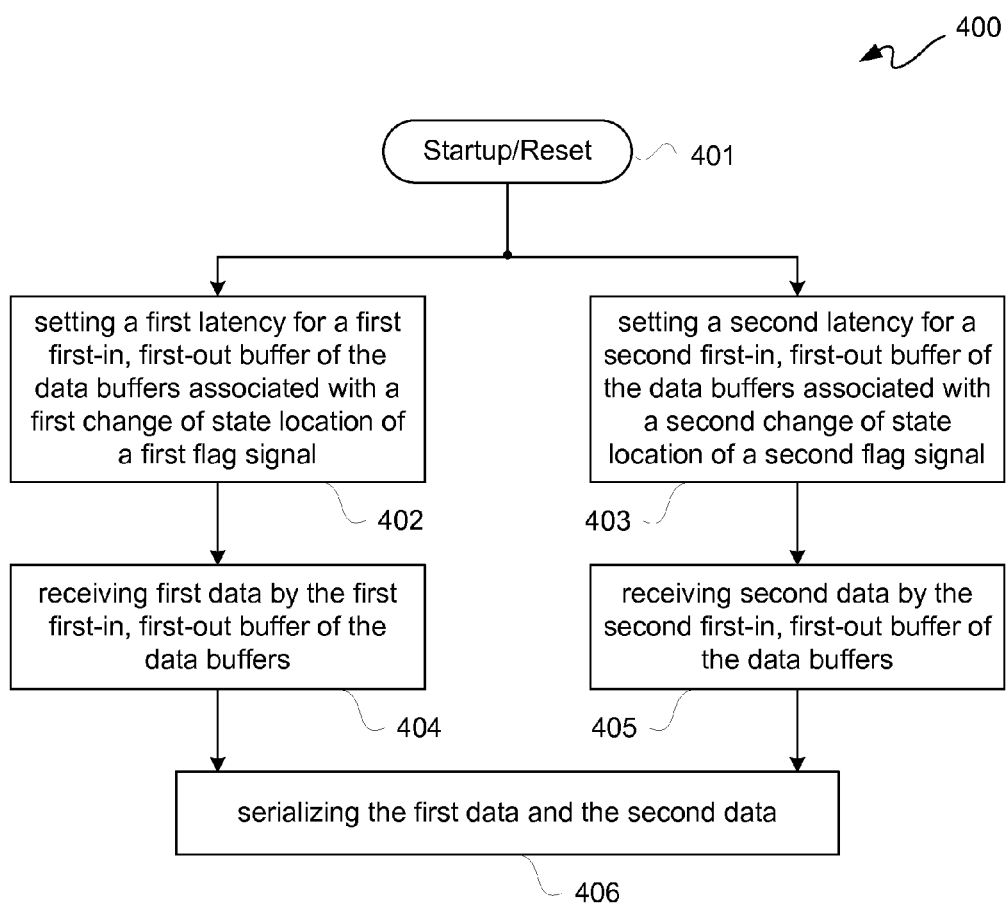
FIG. 4 is a flow diagram depicting an exemplary latency adjustment flow for starting transmitters of FIG. 1.

With the above description borne in mind, FIG. 4 is a flow diagram depicting an exemplary latency adjustment flow 400 for starting a plurality of transmitters 190. FIG. 4 is further described with simultaneous reference to FIGS. 1-4.

At 401, transmitters 190 of an integrated circuit device 100 are started as part of a startup or reset sequence. At 402, transmitter 190-1 is set or adjusted to have a latency for a FIFO 121-1 of FIFOs 121. This latency may be associated with a change of state location of a flag signal 113 of transmitter 190-1, where such adjustment may be an iterative adjustment responsive to feedback of such flag signal 113 for incrementing or decrementing of PI 102 of transmitter 190-1.

In parallel with the operation at 402, at 403 transmitter 190-2 is set or adjusted to have a latency for a FIFO 121-2 of FIFOs 121. This latency may be associated with a change of state location of a flag signal 113 of transmitter 190-2, where such adjustment may be an iterative adjustment responsive to feedback of such flag signal 113 for incrementing or decrementing of PI 102 of transmitter 190-2.

At 404, input data 120-1 may be received by FIFO 121-1, and such input data 120-1 may be output from FIFO 121-1 as output data 122-1. In parallel with the operation at 404, at 405 input data 120-2 may be received by FIFO 121-2, and such input data 120-2 may be output from FIFO 121-2 as output data 122-2. As FIFOs 121-1 and 121-2 may be adjusted to have at least approximately a same latency, lane-to-lane skew with respect to output data 122-1 and 122-2 may be sufficiently small, if any, for serialization at 406 of such parallel output data 122-1 and 122-2. In other words, latency of input data 120-1 passing through FIFO 121-1 is at least sufficiently close to latency of input data 120-2 passing through FIFO 121-2 for an acceptable lane-to-lane skew for serialization.

To recapitulate, for starting or resetting transmitters 190, at 401 a sequence may be initiated for each of such transmitters 190 having corresponding data buffers, such as FIFOs 121. Such sequence may be used to set latency for each of such data buffers in parallel, such as at operations 402 and 403, responsive to execution of such sequence initiated. After which, parallel data may be input and output from such data buffers for subsequent serialization.

Figure 5:
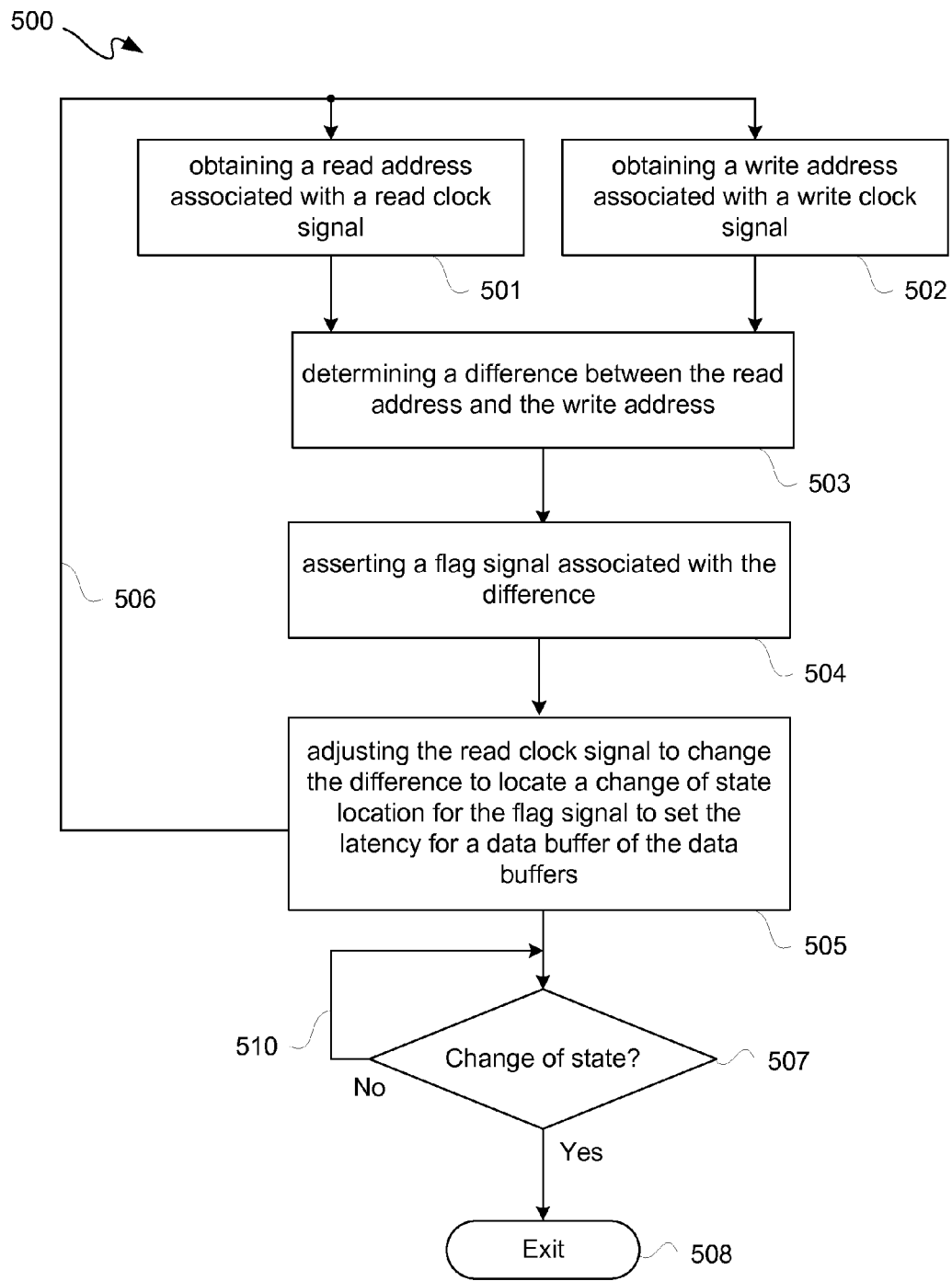
FIG. 5 is a flow diagram depicting an exemplary setting sequence, which may be used for operations of the latency adjustment flow of FIG. 4.

FIG. 5 is a flow diagram depicting an exemplary setting sequence 500, which may be used for operations at 402 and 403 of FIG. 4. FIG. 5 is further described with simultaneous reference to FIGS. 2-5.

At 501, a read address 108 associated with a read clock signal 106 may be obtained. Each read address 108 may be obtained by input of a read clock signal 106 to a divider 104 of an input/output control block, such as input/output control block 161-1 for example. For purposes of clarity by way of example and not limitation, only operation of transmitter 190-1 is further described with reference to setting sequence 500; however, it should be understood that each transmitter 190, such as of a SERDES, may be similarly set. Generally, at the same time read clock signal 106 is provided to divider 104, such read clock signal 106 may be provided to a FIFO, such as FIFO 121-1 for example, to read out output data 122-1 from such FIFO.

Contemporaneous with obtaining a read address at 501, a write address 109 associated with a write clock signal 105 may be obtained at 502. Operations at 501 and 502 may be performed in parallel. Each write address 109 may be obtained by input of a write clock signal 105 to a divider 107 of input/output control block 161-1. Generally, at the same time write clock signal 105 is provided to divider 107, such write clock signal 105 may be provided to FIFO 121-1 to write in input data 120-1 into such FIFO.

Obtaining of a read address 108 may include dividing read clock signal 106 by a divisor associated with a buffer depth to obtain such a read address 108. Likewise, obtaining of a write address 109 may include dividing write clock signal 105 by a same divisor used for obtaining a read address, namely a divisor associated with such buffer depth to obtain such a write address 109.

Dividers 104 and 107 may each be configured to be divide by M dividers, where M is a depth of FIFO 121-1 as previously described. Dividers 104 and 107 may be programmable, and each of dividers 104 and 107 may be preset to divide by M as part of a reset. However, more generally, for a reset, a maximum phase difference as between a write address 109 and a read address 108 is generally preset to a difference between dividers 107 and 104 of at least as one-half of a clock period of either a read or write clock signal, as read and write clocks generally have the same frequency. This difference may be used to ensure that a read from FIFO 121-1 does not occur before a corresponding write to FIFO 121-1 due to propagation delay of clock signal 105. A clock period in this instance may be many multiples of a UI of a PI 102, and such PI may have resolution of $1/16$, $1/32$, $1/64$, etc. of a UI. Therefore, a precise alignment of phases of write and read clock signals may be obtained.

Each read address 108 and each write address 109 respectively output from dividers 104 and 107 may be input to a subtractor 110 to determine a difference 111. Along those lines, at 503 a difference 111 may be determined between read address 108 and a write address 109, which may be associated with one another. Each such difference 111 output from subtractor 110 may be provided to a comparator 112. Each such difference 111 may indicate a difference in phase between a read clock signal 106 and a corresponding write clock signal 105. Difference 111 may be used to determine a domain crossing. Such domain crossing may be identified using Gray Coding. Accordingly, subtractor 110 is more complex than just determining a difference between two addresses, because such write address 109 and read address 108 are generated from two separate clock signals which may be out of phase with respect to one another. In other words, latency measurements may be coarse, as read and write addresses may evolve on clocks that are much lower in frequency than a line rate. Because read and write addresses may evolve on clocks with an unknown relative phase relationship, difference 111 may be obtained by moving both read and write addresses with reference to a common clock, using Gray Coding for address values. Thus, a difference may be associated with crossing a domain in a particular direction, and so Gray Coding is one example of generation of such a difference by having counters (e.g., a read address counter and a write address counter not shown) in subtractor 110 coupled to use Gray Coding. However, other types of coding may be used.

Comparator 112 checks a difference 111 to determine if such difference is less than or equal to a portion of a depth of a data buffer of transmitter data buffers, such as a corresponding FIFO 121-1 of transmitter 190-1. In this example, a flag signal 113 is asserted as a logic 0 if a difference is less than or equal to such a portion of the depth of a FIFO 121-1. If, however, such difference 111 is greater than such portion of the depth of FIFO 121-1, flag signal 113 is asserted as a logic 1. This portion may be an underflow condition, an overflow condition, a half-full condition, or some other fill level of a FIFO.

In this example, comparator 112 checks each difference 111 indicated as coded to determine if such difference is less than or equal to M/2, namely half the depth of FIFO 121-1. Comparator 112 may be programmable and may be preset to compare against M/2. In other words, comparator 112 may be used to determine if a difference 111 is less than or at the midpoint of a FIFO 121-1. At 504, comparator 112 may assert a flag signal 113 associated with each such difference 111, namely whether a difference 111 is less than or equal to a midpoint of a FIFO 121-1. In this example, if a flag signal 113 is a logic 1, a fill level of FIFO 121-1 is more than half; and if such a flag signal is a logic 0, a fill level of FIFO 121-1 is less than or equal to half.

In other words, phase of some parallel data to be transmitted from/in each associated lane therewith may be shifted forward in time by using PI 102 to cause FIFO 121-1 to become progressively more empty up to a point or tap in PI 102 where flag signal 113 transitions from a logic 0 to a logic 1 for all such channels, and phase of other of such parallel data to be transmitted from/in each associated lane therewith may be shifted backward in time by using PI 102 to cause FIFO 121-1 to become progressively more full up to a point or tap in PI 102 where flag signal 113 transitions from a logic 1 to a logic 0 for all such channels. Both of these transition locations may be used; however, for greater equalization of latencies among all such channels either a logic 0 transition location or a logic 1 transition location may be set. In other words, flag signal 113 may be either logic 1 or logic 0 for all channels after equalization of latencies. Any residual lane-to-lane skew of FIFOS 121 may be limited by PI 102 resolution, for example such a $\frac{1}{64}^{th}$ of a UI in some PIs.

In this example, each data buffer, such as FIFOs 121 for example, of transmitters 190 may be adjusted to be set to a midpoint after a startup or reset sequence. However, other setting locations within data buffers, other than a midpoint setting, may be used. Furthermore, data buffers may be set to different locations with respect to one another. In short, such settings may be tailored to an application and/or an integrated circuit device to minimize or otherwise reduce lane-to-lane skew.

At 505, flag signal 113 may be provided to an increment/decrement control block 114 to provide an adjustment signal 115. Adjustment signal 115 may be provided to a PI 102 for adjusting read clock signal 106 to change difference 111 to locate a change of state location for flag signal 113 to set a latency for a data buffer of data buffers, such as FIFO 121-1 of FIFOs 121 of corresponding transmitters 190. Operations 501 through 505 may be repeated, as indicated by connector 506, to locate a change of state location of flag signal 113.

Once PI 102 receives an adjustment signal 115 indicating a change of state location as generally indicated as determined at 507, such a change of state location may be for a domain crossing between a read time domain of read clock signal 106 and a write time domain of write clock signal 105 corresponding to such read clock signal 106. PI 102 may ignore such a current adjustment signal 115, as a latency for a FIFO 121-1 is effectively set to such change of state location. Thus, PI 102 may at 508 effectively exit setting sequence 500. If a change of state location is not yet found, then PI 102 may continue setting sequence 500, as generally indicated by connector 510. Generally, once data buffers of SERDES transmitters 190 are all set to a same latency, such as a midpoint of each of FIFOs 121, such latency adjustments may not have to be readjusted after a startup sequence or a reset of transmitters 190. In other words to equalize latency in multiple channels of a transmitter SERDES, rather than having a circuit that imposes a constant latency over voltage and/or temperature variations, latencies of FIFOs adjusted as described herein simply change with voltage and/or temperature, staying at least sufficiently equal to each other. In other words, during operation, due to temperature and/or supply voltage change, FIFO latencies can change, even significantly, but all such FIFO latency generally stay equal to each other.

PI 102, in each transmitter 190, stops as soon as flag signal 113 switches from a logic 1 to a logic 0, or from a logic 0 to logic 1, state as determined at 507. This transition in logic state marks the end of an adjustment phase, which may be used for equalizing latency for all transmitters 190 with a very high precision, which may be limited only by the resolution of corresponding PIs 102. Thus, after a completed execution of setting sequence 500, such sequence may be exited so as to avoid having PI 102 continuously running. Having a continuously running PI would lower output quality due to jitter introduced by such a continuously running PI.

Each data buffer of data buffers 121 of corresponding transmitters 190 may be set at least to approximately a same latency value. More particularly, each data buffer of data buffers 121 of corresponding transmitters 190 may be set to have a same latency value, subject to granularity of PI 102.

Repeated assertion of flag signals 113 of corresponding FIFOs 121 of transmitters 190 effectively may cause toggling of such flag signals. A PI 102 may thus be controlled to cause an associated flag signal 113 to toggle, namely be "on the edge" of a transition location. Along those lines, flag signals 113 asserted for sequences corresponding to data buffers may include both logics 0s and logic 1s for an initial cycle of such sequences at startup or reset. This means that two or more identical transmitters may come out of reset with different latencies, as they may be at different fill levels. In transmitters, this may be caused by an unknown phase relationship between an external FIFO reset signal and internal read clock signals 106. If FIFOs 121 are N bits wide, multiple transmitters 190 may exhibit a maximum of N bits of lane-to-lane skew. If N is equal to 16 or so, a conventional SERDES would have parallel input bit width greater than N. However, protocols such as XAUI, PCI Express and SFI-5 have a lane-to-lane skew specification much less than 16. These protocols may involve having a minimal lane-to-lane skew, while latency, which may have to be equal for all lanes, can be change during operation.

As described above, lane-to-lane de-skew may be provided without using a delay aligner and while keeping a PI off during data transfer operations. Furthermore, input/output control block is digital circuitry, which apart from feeding back flag signal 113 as described above, such circuitry may be present in existing transmitters.

PI 102 allows shifting of phase of data to be transmitted, independently on each SERDES transmitter. Optionally, a bit skip in a high-speed transmit divider may be used; however, a PI 102 may be used to obtain a higher precision in reducing residual lane-to-lane skew. However, no actual latency measurement need be taken, rather a flag triggered by a specified FIFO filling level may be used. Such flag generation is a much simpler circuit than that used to measure latency. Moreover, flag generation may be performed with high resolution with respect to differences in phase. The term "flag" was used; however, an overflow/underflow level signal may be used for such a flag signal.

The above-description was for operation of a transmitter SERDES. However, the above description may be used for receivers when locked in a reference mode and driven by a same signal. Along those lines, receivers may be equalized when locked in a reference mode by feeding such receivers with transmitters in serial loopback with equalized lane-to-lane transmitter skew to provide for interleaved receiver oversampling of incoming data.

Because one or more of the examples described herein may be implemented in an FPGA, a detailed description of such an IC is provided. However, it should be understood that other types of ICs may benefit from the technology described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 6:
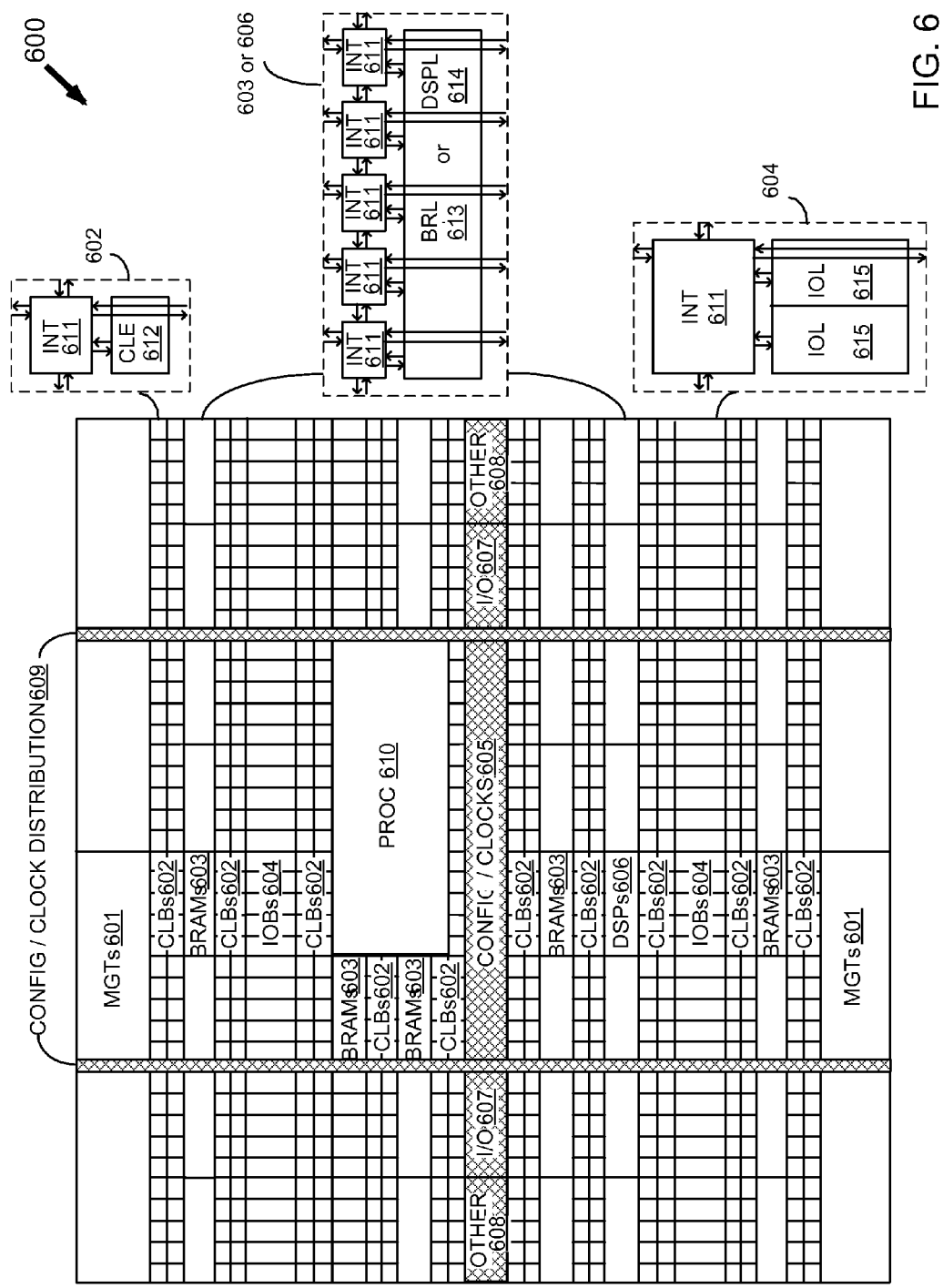
FIG. 6 is a simplified block diagram depicting an exemplary columnar Field Programmable Gate Array ("FPGA") architecture.

As noted above, advanced FPGAs can include several different types of programmable logic blocks in the array. For example, FIG. 6 illustrates an FPGA architecture 600 that includes a large number of different programmable tiles including multi-gigabit transceivers ("MGTs") 601, configurable logic blocks ("CLBs") 602, random access memory blocks ("BRAMs") 603, input/output blocks ("IOBs") 604, configuration and clocking logic ("CONFIG/CLOCKS") 605, digital signal processing blocks ("DSPs") 606, specialized input/output blocks ("I/O") 607 (e.g., configuration ports and clock ports), and other programmable logic 608 such as digital clock managers, analog-to-digital converters, system monitoring logic, and so forth. Some FPGAs also include dedicated processor blocks ("PROC") 610.

In some FPGAs, each programmable tile includes a programmable interconnect element ("INT") 611 having standardized connections to and from a corresponding interconnect element in each adjacent tile. Therefore, the programmable interconnect elements taken together implement the programmable interconnect structure for the illustrated FPGA. The programmable interconnect element 611 also includes the connections to and from the programmable logic element within the same tile, as shown by the examples included at the top of FIG. 6.

For example, a CLB 602 can include a configurable logic element ("CLE") 612 that can be programmed to implement user logic plus a single programmable interconnect element ("INT") 611. A BRAM 603 can include a BRAM logic element ("BRL") 613 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 606 can include a DSP logic element ("DSPL") 614 in addition to an appropriate number of programmable interconnect elements. An IOB 604 can include, for example, two instances of an input/output logic element ("IOL") 615 in addition to one instance of the programmable interconnect element 611. As will be clear to those of skill in the art, the actual I/O pads connected, for example, to the I/O logic element 615 typically are not confined to the area of the input/output logic element 615.

In the pictured embodiment, a horizontal area near the center of the die (shown in FIG. 6) is used for configuration, clock, and other control logic. Vertical columns 609 extending from this horizontal area or column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, processor block 610 spans several columns of CLBs and BRAMs.

Note that FIG. 6 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 6 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. A method for starting a plurality of transmitters, comprising:
    initiating a sequence for each of the plurality of transmitters having corresponding data buffers; and
    setting latency for each of the data buffers responsive to execution of the sequence;
    wherein the sequence comprises:
        obtaining a read address associated with a read clock signal;
        obtaining a write address associated with a write clock signal;
        determining a difference between the read address and the write address;
        asserting a flag signal associated with the difference; and
        adjusting the read clock signal to change the difference to locate a change of state location for the flag signal to set the latency for a data buffer of the data buffers;
        wherein the change of state location is for a domain crossing between a read time domain of the read clock signal and a write time domain of the write clock signal.

2. The method according to claim 1, wherein each of the data buffers of the plurality of transmitters is set at least to approximately a same value for the latency.

3. The method according to claim 2, wherein: the plurality of transmitters are associated with a plurality of lanes; and the plurality of lanes have a maximum lane-to-lane skew for parallel data distributed across the plurality of transmitters to be readied for serialization.

4. The method according to claim 2, wherein each of the data buffers is set to a midpoint after the sequence.

5. The method according to claim 4, wherein the data buffers are first-in, first-out buffers having registers for storing data.

6. The method according to claim 4, wherein the data buffers are first-in, first-out buffers having memory cells for storing data.

7. The method according to claim 4, wherein the plurality of transmitters are of a corresponding plurality of transceivers.

8. A method for starting a plurality of transmitters, comprising:
    initiating a sequence for each of the plurality of transmitters having corresponding data buffers; and
    setting latency for each of the data buffers responsive to execution of the sequence;
    wherein the sequence comprises:
        obtaining a read address associated with a read clock signal;
        obtaining a write address associated with a write clock signal;
        determining a difference between the read address and the write address;
        asserting a flag signal associated with the difference;
        adjusting the read clock signal to change the difference; and
        repeating the steps of the sequence to locate a change of state location of the flag signal;
    wherein the change of state location is for a domain crossing between a read time domain of the read clock signal and a write time domain of the write clock signal; and
    wherein the latency for a data buffer of the data buffers is set to the change of state location.

9. The method according to claim 8, wherein repeated assertion of flag signals corresponding to the data buffers is for toggling the flag signals.

10. The method according to claim 8, wherein: if the difference is less than or equal to a portion of a buffer depth of the data buffer of the data buffers, the flag signal is asserted as a logic 0; and if the difference is greater than the portion of the depth of the data buffer, the flag signal is asserted as a logic 1.

11. The method according to claim 10, wherein: if the flag signal is the logic 1, a fill level of the data buffer is more than half; and if the flag signal is the logic 0, the fill level of the data buffer is less than or equal to half.

12. The method according to claim 10, wherein: the sequence is initiated at startup or reset of the plurality of transmitters; and flag signals asserted for the sequence correspond to the data buffers and include both logics 0s and logic is for an initial cycle of the sequence.

13. The method according to claim 8, wherein the obtaining of the read address comprises dividing the read clock signal by a divisor associated with a buffer depth of the data buffer to obtain the read address.

14. The method according to claim 11, wherein the obtaining of the write address comprises dividing the write clock signal by the divisor associated with the buffer depth of the data buffer to obtain the write address.

15. The method according to claim 8, wherein the determining of the difference comprises Gray coding.

16. The method according to claim 8, further comprising: setting a first latency for a first first-in, first-out buffer of the data buffers associated with a first change of state location of a first flag signal; setting a second latency for a second first-in, first-out buffer of the data buffers associated with a second change of state location of a second flag signal; receiving first data by the first first-in, first-out buffer of the data buffers; receiving second data by the second first-in, first-out buffer of the data buffers; and wherein the first latency of the first data passing through the first first-in, first-out buffer is at least sufficiently close to the second latency for the second data passing through the second first-in, first-out buffer for an acceptable lane-to-lane skew.

17. An integrated circuit device having a plurality of transmitters, comprising:
- a first transmitter of the plurality of transmitters including a first data buffer and a first input/output control block coupled to the first data buffer;
- a second transmitter of the plurality of transmitters including a second data buffer and a second input/output control block coupled to the second data buffer;
- wherein the first data buffer has a first delay;
- wherein the second data buffer has a second delay;
- wherein the first input/output control block is:
    - coupled to receive a write clock signal and a first read clock signal and configured to generate a first write address and a first read address respectively therefor;
    - configured to determine a first difference between the first write address and the first read address and to assert a first flag signal associated with the first difference; and
    - coupled to feedback the first flag signal to adjust the first read clock signal to adjust the first difference to reach a first change of state location for the first flag signal associated with a first position in the first data buffer; and
- wherein the second input/output control block is:
    - coupled to receive the write clock signal and a second read clock signal and configured to generate a second write address and a second read address respectively therefor;
    - configured to determine a second difference between the second write address and the second read address and to assert a second flag signal associated with the second difference; and
    - coupled to feedback the second flag signal to adjust the second read clock signal to adjust the second difference to reach a second change of state location for the second flag signal associated with a second position in the second data buffer;
- wherein the first change of state location is for a first domain crossing between a first read time domain of the first read clock signal and a first write time domain of the write clock signal; and
- wherein the second change of state location is for a second domain crossing between a second read time domain of the second read clock signal and a second write time domain of the write clock signal.

18. The integrated circuit device according to claim 17, wherein the first transmitter and the second transmitter are both of a serializer-deserializer transmitter coupled to receive parallel data and to provide the parallel data respectively in first lane and a second lane for conversion to serial data.

19. The integrated circuit device according to claim 17, wherein: the first input/output control block and the second input/output control block respectively include a first phase interpolator and a second phase interpolator; the first phase interpolator is coupled to receive the first flag signal as feedback to adjust the first read clock signal; and the second phase interpolator is coupled to receive the second flag signal as feedback to adjust the second read clock signal.

20. The integrated circuit device according to claim 19, wherein: the first position and the second position correspond to a first point in a unit interval of the first phase interpolator and a second point in the unit interval of the second phase interpolator; the first point is associated with the first delay; the second point is associated with the second delay; the first phase interpolator is adjustable responsive to the first flag signal to locate the first domain crossing between the first read time domain of the first read clock signal and the first write domain of the write clock signal; the second phase interpolator is adjustable responsive to the second flag signal to locate the second read time domain of the second read clock signal and the second write domain of the write clock signal; and the first phase interpolator and the second phase interpolator are adjustable for equalization of the first delay and the second delay respectively associated with the first domain crossing and the second domain crossing.

* * * * *